(12) United States Patent
Okitaka

(10) Patent No.: US 6,343,366 B1
(45) Date of Patent: Jan. 29, 2002

(54) BIST CIRCUIT FOR LSI MEMORY

(75) Inventor: Takenori Okitaka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/225,346

(22) Filed: Jan. 5, 1999

(30) Foreign Application Priority Data

Jul. 15, 1998 (JP) ............................................. 10-200867

(51) Int. Cl.[7] .......................... G01R 31/28; G11C 29/00
(52) U.S. Cl. ........................................ 714/733; 714/719
(58) Field of Search ................................. 714/733, 710, 714/711, 6, 7, 8, 719

(56) References Cited

U.S. PATENT DOCUMENTS

| | | | |
|---|---|---|---|
| 4,757,503 A | * 7/1988 | Hayes et al. ................. 371/21 |
| 5,383,195 A | * 1/1995 | Spence et al. ............... 714/733 |
| 5,506,959 A | * 4/1996 | Cockburn .................... 714/42 |
| 5,577,050 A | 11/1996 | Bair et al. ................... 371/10.2 |
| 5,661,729 A | 8/1997 | Miyazaki et al. ........... 371/21.2 |
| 5,920,515 A | * 7/1999 | Shaik et al. ................. 365/200 |
| 5,961,653 A | * 10/1999 | Kalter et al. ................ 714/7 |
| 6,014,752 A | * 1/2000 | Hao et al. .................... 713/500 |
| 6,065,134 A | * 5/2000 | Bair et al. .................... 714/7 |
| 6,085,334 A | * 7/2000 | Giles et al. .................. 714/7 |
| 6,145,105 A | * 11/2000 | Nadeau-Dostie et al. ... 714/726 |

* cited by examiner

Primary Examiner—Albert Decady
Assistant Examiner—Joseph D. Torres
(74) Attorney, Agent, or Firm—Burns, Doane, Swecker & Mathis, LLP

(57) ABSTRACT

A BIST circuit built in a LSI device incorporating a LSI memory such as a DRAM, a SRAM, a Flash memory, and the like has a repair code generator/register (7) and a selector (6) or a self repair circuit (8). The repair code generator/register (7) generates a repair code regarding information of a redundancy memory cell to be used instead of a faulty memory cell when a comparator (3) indicates that a memory cell array (51) includes the faulty memory cell. The selector (6) selectively outputs data stored in the GO/NG register (4) and the repair code generator/register (7). The self repair circuit (8) repairs the faulty memory cell based on the repair code.

6 Claims, 5 Drawing Sheets

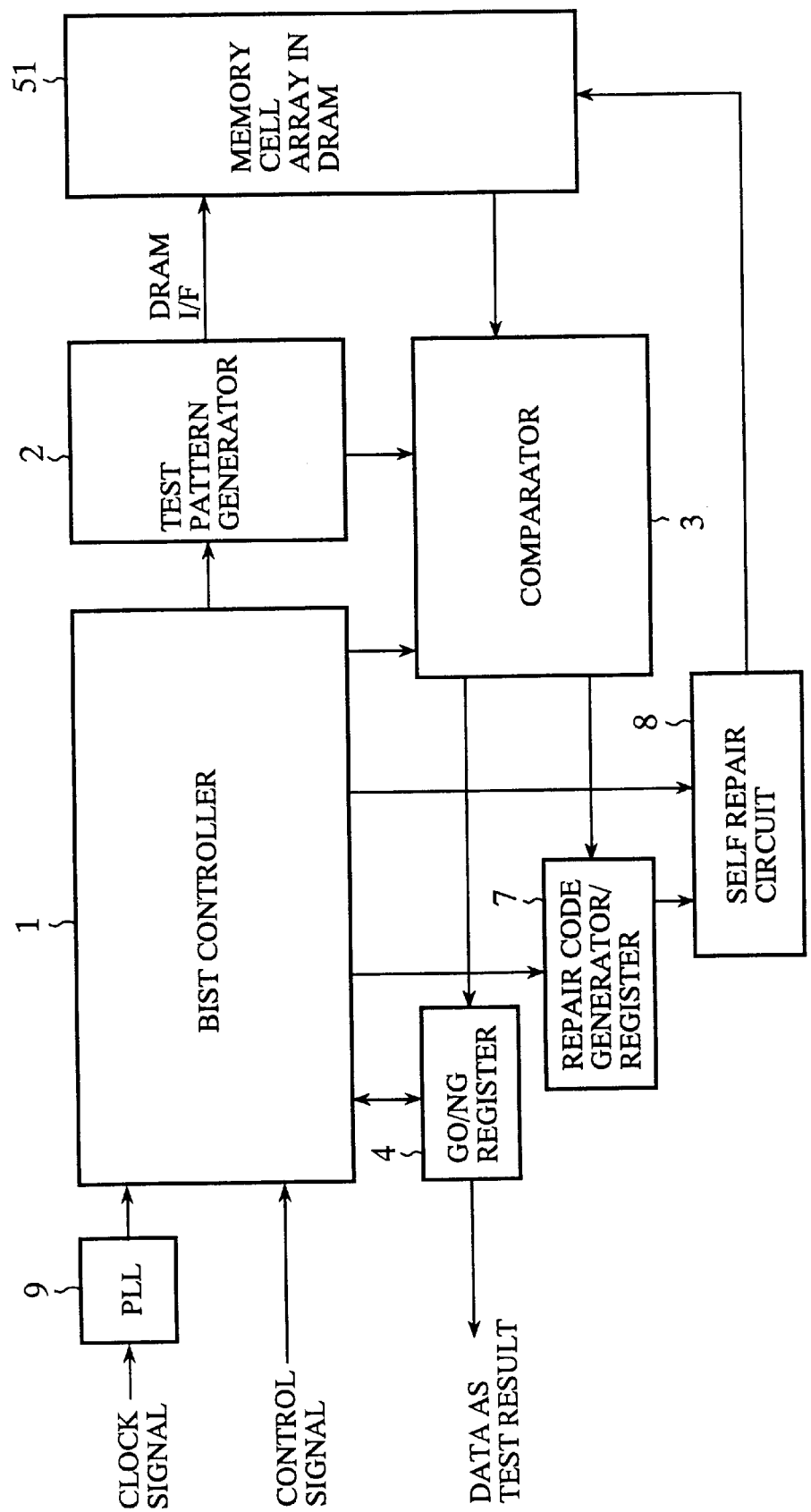

BIST CIRCUIT FOR LSI MEMORY

BACKGROUND OF THE INVENTION

1. Field of the Invention

The present invention relates to a Built-In Self Test (BIST) circuit for a Large Scale Integrated (LSI) memory built in a LSI incorporating the LSI memory such as a Dynamic Random Access memory (DRAM), a Static Random Access Memory (SRAM), a Flash memory and the like.

2. Description of the Prior Art

FIG. 1 is a block diagram showing a configuration of a conventional LSI incorporating a LSI memory. In FIG. 1, the reference number 51 designates a memory cell array such as a DRAM, a SRAM, a Flash memory, and the like. The reference number 52 denotes an internal circuit for reading data stored in the memory cell array 51 and for performing a predetermined function under the control of a CPU (omitted from FIG. 1). The reference numbers 53 and 54 indicate selectors for changing data paths, namely, for connecting the internal circuit 52 to the memory cell array 51 in order to transfer data between them during a normal operation mode, and for connecting a control signal input terminal and a test data input terminal to the memory cell array 51 in order to transfer control data and test data to the memory cell array 51 and to transfer test results from the memory cell array 51 to an external tester (omitted from FIG. 1) through a test data output terminal during a test operation mode.

During the test operation mode for the memory cell array 51 incorporated in the conventional LSI shown in FIG. 1, the control signal input terminal, the test data input terminal, the test data output terminal, and the selectors 53 and 54 are connected to the external tester (not shown) in order to perform the operation test of the memory cell array 51.

Next, a description will be given of the operation of the conventional LSI comprising the LSI memory.

During the operation test for the memory cell array 51, the external tester transfers a control signal to both the selectors 53 and 54 through the control signal input terminal. This transferring of the control signal enters the state in which the external tester may control the operation of the memory cell array 51.

Next, when receiving input the control signals from the external tester, both the selectors 53 and 54 disconnect the memory cell array 51 from the internal circuit 52, and connect the memory cell array 51 to the external tester through the test data input terminal and the test data output terminal.

Next, the external tester generates and outputs the test data to the memory cell array 51 through the test data input terminal. After this, the test data from the memory cell array 51 are transferred to the external tester through the test data output terminal. The external tester checks the test data from the memory cell array 51 whether the memory cell array 51 operates correctly or not.

Since the conventional LSI incorporating the memory cell array 51 such as a DRAM, a SRAM, a flash memory, and the like has the configuration described above, when performing the operation test such as a AT-speed memory test for the built-in memory cell array 51, it must be required to install a plurality of test data input terminals and a plurality of test data output terminals only for the test operation in addition to data input/output terminals only for the normal operation mode. For example, it must be required to install several ten or several hundred test data input terminals and test data output terminals for the test operation of the memory cell array. This causes to increase the number of terminals in the LSI and to reduce the circuit area in which internal circuits are formed, and further to increase the fabrication cost of the LSI.

Further, external testers are usually expensive devices. When the number of test terminals in a LSI is increased, the cost of the tester is also increased. As a result, this causes to increase the fabrication cost.

Moreover, since it is required to use a clock signal of a higher frequency for testing the reliability of the memory cell array 51, it is required to use the external tester capable of outputting the clock signal of a higher frequency. Therefore, this causes to increase the cost of the external tester, and to increase the fabrication cost of the LSI.

Furthermore, when logic circuits such as the internal circuit 52 are tested in addition to the memory cell array 51, it must be required to use a memory logic tester that is higher expensive in cost or to use both testers for the memory cell array 51 and the logic circuit, respectively. Therefore, this causes to increase the fabrication cost of the LSI.

SUMMARY OF THE INVENTION

Accordingly, an object of the present invention is, with due consideration to the drawbacks of the conventional technique, to provide a Built-in Self Test (BIST) circuit built in a LSI incorporating a large scale integrated memory such as a DRAM, a SRAM, a flash memory, and the like. The BIST circuit can perform the test operation for the large scale integrated memory including the generation of test data, the comparison of the test data, the detection of a faulty memory cell in the large scale integrated memory, and the self-repairing operation for the faulty memory cell.

In accordance with a preferred embodiment of the present invention, a Built-In Self Test (BIST) circuit for a Large Scale Integrated (LSI) memory built in a LSI incorporating the LSI memory, comprises a BIST controller for controlling an operation test for a memory cell array forming the LSI memory having a plurality of memory cells, a test pattern generator storing micro codes to be used for generation of test pattern data for executing the micro codes based on an instruction transferred from the BIST controller in order to generate the test pattern data and expected data and for outputting the test patterns and the expected data, a comparator for comparing the test pattern data outputted from the memory cell array, that have read the test pattern data supplied from the test pattern generator, with the expected data, a GO/NG register for storing data indicating whether the operation of the memory cell array has been performed normally or abnormally based on the comparison result of the comparator and outputting the data, an error information register for storing information regarding a bit line and a word line at which a faulty memory cell is formed when the comparison result from the comparator indicates that the memory cell array has operated abnormally, and a selector for selectively outputting the data and the information stored in the GO/NG register and the error information register to external devices. By using the configuration described above, the number of terminals of the LSI may be decreased and the test operation for the memory cell array in the LSI may be performed efficiently, so that the fabrication cost of the LSI may be also reduced.

The BIST circuit for the LSI memory built in the LSI incorporating the LSI memory as another preferred embodiment according to the present invention further comprises a repair code generator/register, that is incorporated in the BIST circuit instead of the error information register, for generating a repair code regarding information of a redundancy memory cell built in the LSI in advance to be used instead of the faulty memory cell when the comparison result from the comparator indicates that the memory cell array has operated abnormally. In the BIST circuit, the selector selectively outputs the repair code stored in the repair code generator/register and the data stored in the GO/NG register. By using the configuration described above, the number of terminals of the LSI may be decreased and the test operation of the memory cell array in the LSI may be performed efficiently in order to generate data for avoiding the use of the faulty memory cell, so that the fabrication cost of the LSI may be also reduced.

In accordance with another preferred embodiment of the present invention, a Built-In Self Test (BIST) circuit for a Large Scale Integrated (LSI) memory built in a LSI incorporating the LSI memory, comprises a BIST controller for controlling an operation test for a memory cell array forming the LSI memory having a plurality of memory cells, a test pattern generator storing micro codes to be used for generation of test pattern data for executing the micro codes based on an instruction transferred from the BIST controller in order to generate the test pattern data and expected data and for outputting the test patterns and the expected data, a comparator for comparing the test pattern data outputted from the memory cell array, that have read the test pattern data supplied from the test pattern generator, with the expected data, a GO/NG register for storing data indicating whether the operation of the memory cell array has been performed normally or abnormally based on the comparison result of the comparator and outputting the data, a repair code generator/register for generating a repair code regarding a bit line and a word line at which a faulty memory cell is formed when the comparison result from the comparator indicates that the memory cell array has operated abnormally, and a self repair circuit for reading the data stored in the repair code generator/register and for performing a repair operation in which the faulty memory cell is replaced with a redundancy memory circuit that has been built in the memory cell array in advance and the redundancy memory cell is activated. By using the configuration described above, the number of terminals to be used for the test operation of the memory cell array in the LSI may be decreased and the operation test for the memory cell array may be performed efficiently in order to generate repair data for repairing the faulty memory cell and to use the redundancy memory cell instead of the faulty memory cell, so that the fabrication cost of the LSI may be also reduced.

The BIST circuit for the LSI memory built in the LSI incorporating the LSI memory as another preferred embodiment according to the present invention further comprises a phase locked loop (PLL) for receiving an external clock signal supplied externally, for generating an internal clock signal of a predetermined frequency based on the received external clock signal, and for outputting the internal clock signal into the BIST controller. By using the configuration described above, it is possible to generate the internal clock signal of an optimum high frequency for the test operation, so that it is possible to execute the test operation such as AT-speed memory test for the memory cell array, even if an external tester for supplying an external clock signal of a low frequency.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 5 is a block diagram showing a configuration of a BIST circuit for a large scale integrated memory built in a LSI according to the fourth embodiment of the present invention.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 1:
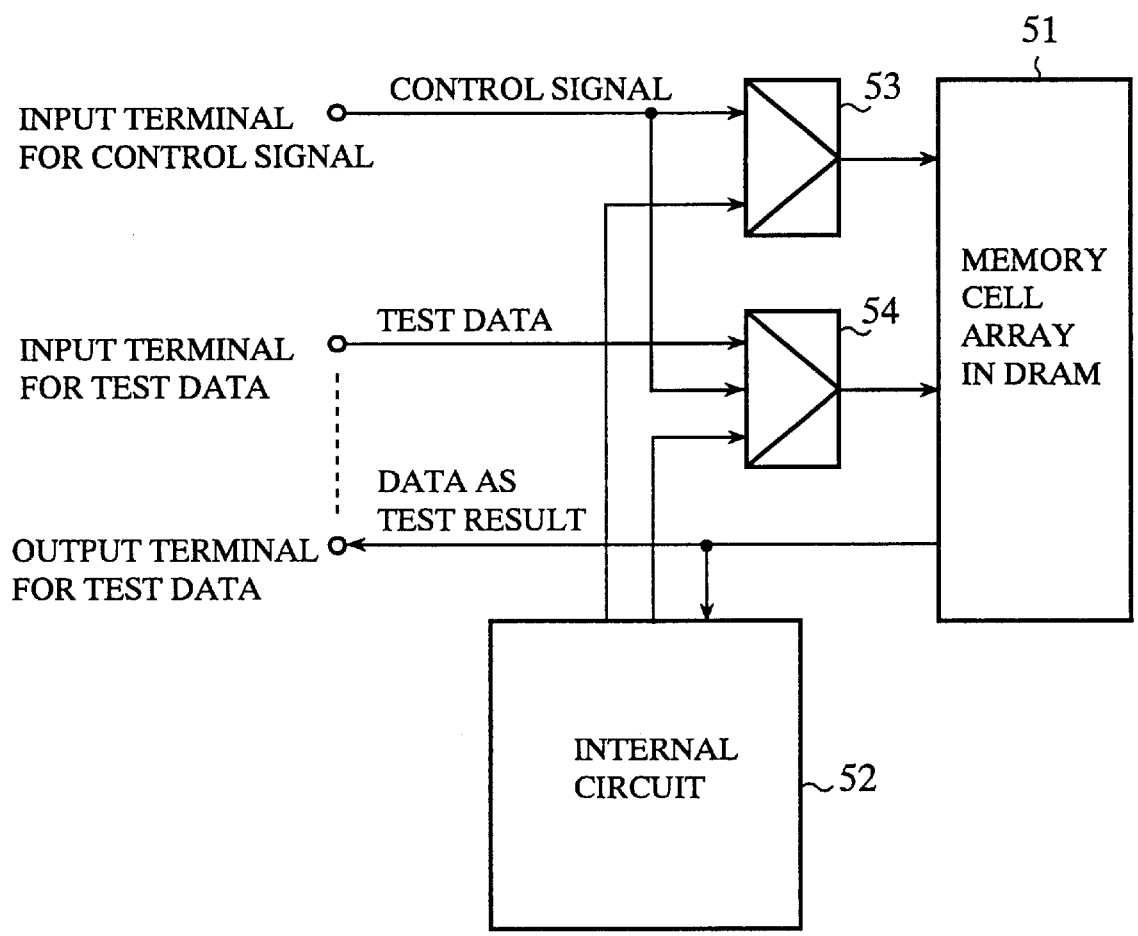
FIG. 1 is a block diagram showing a configuration of a conventional LSI comprising a LSI memory.
Figure 2:
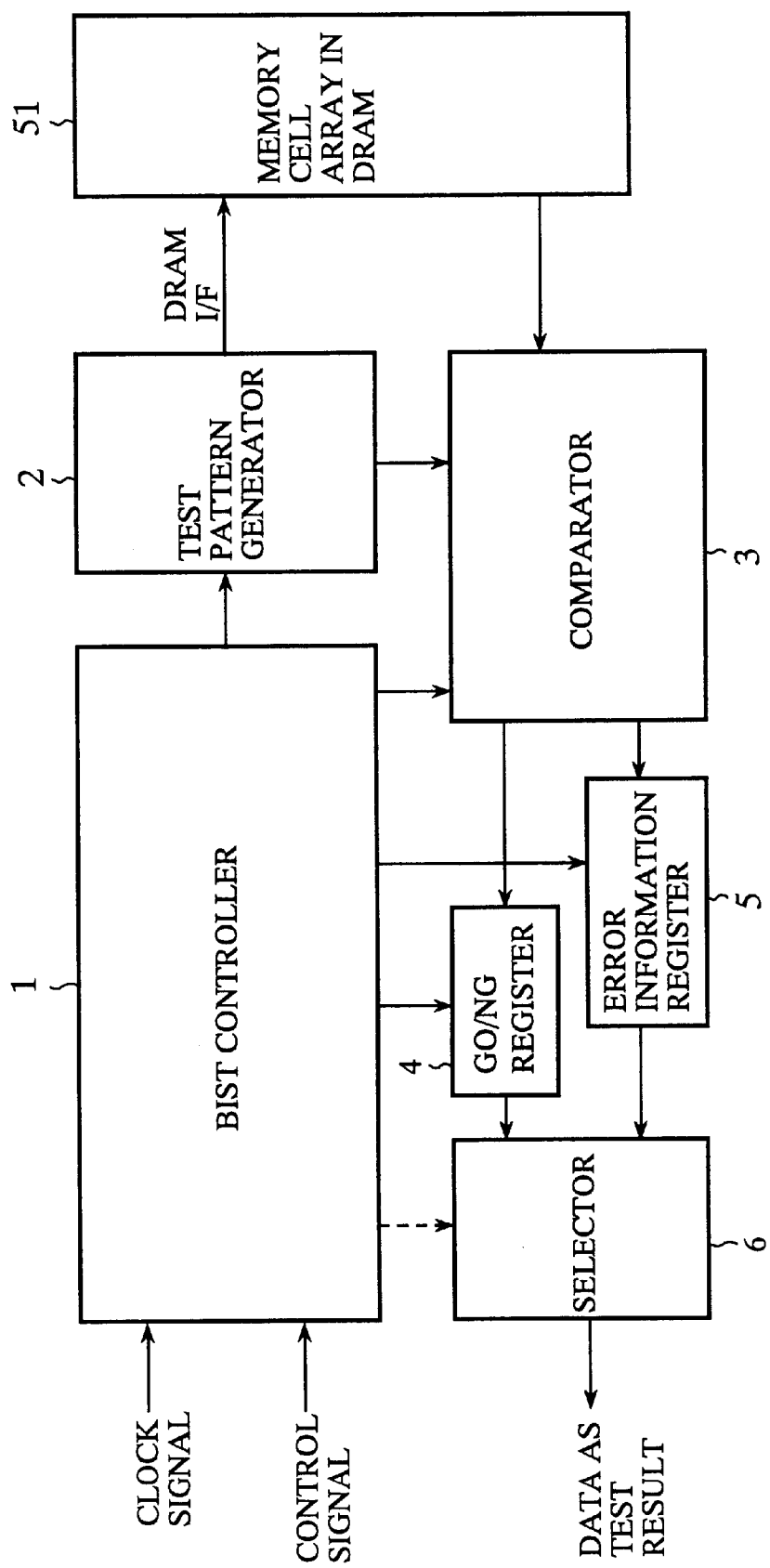
FIG. 2 is a block diagram showing a configuration of a BIST circuit for a large scale integrated memory built in a LSI according to the first embodiment of the present invention.

FIG. 2 is a block diagram showing the configuration of the built-in self test (BIST) circuit for a LSI capable of testing a large scale integrated (LSI) memory such as a Dynamic Random Access Memory (DRAM), a Static Random Access Memory (SRAM), a Flash memory, and the like built in the LSI according to the first embodiment of the present invention. In FIG. 2, the reference number 1 designates a built-in self test (BIST) controller for controlling a self test operation. The reference number 2 denotes a test pattern generator, in which micro codes by which test patterns are generated are stored in advance, for generating the test patterns consisting of control signals, test data, and expected value data, and for outputting the test patterns to the memory cell array 51 such as a DRAM, a SRAM, a Flash memory, and the like, and for further outputting the generated expected value data to a comparator (that will be explained later in detail). The reference number 3 indicates the comparator for comparing the data transferred from the memory cell array 51 with the expected values generated by the test pattern generator 2. The reference number 4 designates a GO/NG register for storing data indicating a comparison result of the test operation to be performed by the comparator 3 for the memory cell array 51, namely the comparison result from the comparator 3 indicating whether the test operation has been completed normally or abnormally. The reference number 5 designates an error information register for storing data regarding a bit line and a word line at which a faulty memory cell in the memory cell array 51 is formed based on the comparison result of the comparator 3. The reference number 6 denotes a selector for selecting the data stored in both the GO/NG register 4 and the error information register 5, and for outputting the data to outside devices such as an external tester (omitted from FIG. 2).

Next, a description will be given of the operation of the BIST circuit built in the LSI including the LSI memory according to the first embodiment.

When receiving both a clock signal (or an external clock signal transferred from the external tester, for example) and a control signal (that is also transferred from the external tester, for example) transferred externally indicating the commencement of the self test operation of the memory cell array 51, the BIST controller 1 outputs a control signal to the test pattern generator 2, the comparator 3, the GO/NG register 4, and the error information register 5 in order to enter them into a self test operation mode. Next, when inputting the control signal indicating the commencement of the self test operation transferred from the BIST controller 1, the test pattern generator 2 executes the micro-codes for test patterns, that have been stored in a test program in advance therein, in order to generate test pattern data and expected value data consisting of control signals and data. Following this, the test pattern generator 2 writes the generated test pattern data into the memory cell array 51 and also outputs the generated expected value data into the comparator 3. The comparator 3 reads the test pattern data that have been written into the memory cell array 51 and then compares the data with the expected value data transferred from the test pattern generator 2 in order to check whether the memory cell array 51 has operated normally or abnormally.

When both the test pattern data from the memory cell array 51 and the expected value data are equal to each other in the comparison operation, the comparator 3 generates a control data indicating that the memory cell array 51 has operated normally and correctly and outputs the control data indicating the normal operation of the memory cell array 51 to the GO/NG register 4. On the contrary, if the test pattern data from the memory cell array 51 are not equal to the expected value data to each other in the comparison operation by the comparator 3, namely, when there is at least one data item that is not equal to an expected value data item, the comparator 3 generates a control signal indicating that the memory cell array 51 has operated abnormally and outputs data regarding the bit line (a faulty bit) and the word line at which a faulty memory cell is formed into the error information register 5.

Next, the selector 6 selects the data stored in the GO/NG register 4 under the control of the external tester (omitted from FIG. 2) connected to the BIST circuit in the LSI and then outputs the data stored in the GO/NG register 4 to the external tester.

When the data stored in the GO/NG register 4 indicates the abnormal operation of the memory cell array 51, the external tester transfer to the selector 6 a control signal indicating that the selector 6 is electrically connected to the error information register 5 from the GO/NG register 4. Then, the external tester may obtain the data regarding the faulty memory cell and generates an instruction in order to repair the faulty memory cell and transfers it to the LSI.

As described above, according to the first embodiment, by incorporating the BIST circuit into a LSI including a LSI memory such as a DRAM, a SRAM, a Flash memory, and the like, the test pattern generator 2 generates test pattern data and expected value data by its own function, the self-operation test for the memory cell array 51 is execute in order to test the operation of the memory cell array 51, and the test results and the information regarding a bit line and a word line at which a fault memory cell is formed are then stored into both the GO/NG register 4 and the error information register 5, the stored data items are read out selectively to an external device such as a simple logic tester. It is thereby possible to use the simple logic tester instead of any expensive external tester having many terminals for test operation, so that a redundancy memory cell may be used instead of the faulty memory cell. Furthermore, since the number of input/output terminals to be used for the test operation may be decreased, it is possible to reduce the fabrication cost of the LSI. In addition, it is possible to read and use selectively the error data stored in both the GO/NG register 4 and the error information register 5 in order to repair the faulty memory cell.

Second Embodiment

Figure 3:
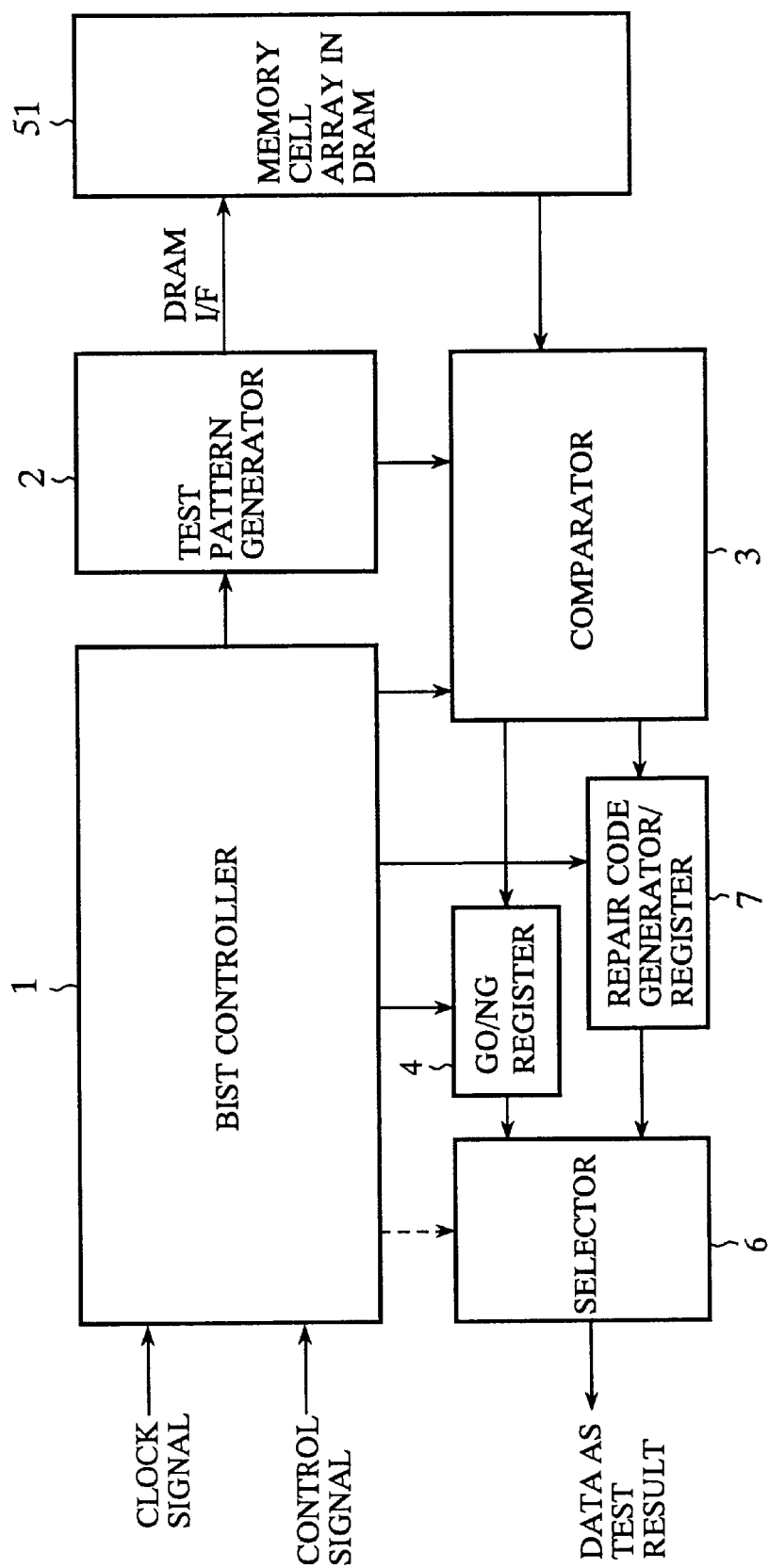
FIG. 3 is a block diagram showing a configuration of a BIST circuit for a large scale integrated memory built in a LSI according to the second embodiment of the present invention.

FIG. 3 is a block diagram showing the configuration of the BIST circuit for a large scale integrated (LSI) memory such as a DRAM, a SRAM, a Flash memory, and the like built in a LSI according to the second embodiment of the present invention. By incorporating this BIST circuit of the second embodiment into the LSI, or other integrated circuit device, the test operation for the built-in LSI memory may be performed, so that a faulty memory cell may be replaced with a redundancy memory cell in order to avoid the use of the faulty memory cell. In FIG. 3, the reference number 7 designates a repair code generator/register for generating a repair code to repair a faulty memory cell and for storing the repair code into a register incorporated in the repair code generator/register 7 based on information regarding a bit line and a word line at which the faulty memory cell is formed when there is the faulty memory cell in the memory cell array 51 as a comparison result of the comparison operation between the test pattern data from the memory cell array 51 and the expected value data performed by the comparator 3. Other components in the BIST circuit as the second embodiment are the same of the components in the BIST circuit as the first embodiment, and the same reference numbers are used for the same components, and the explanation of them is therefore omitted here for brevity.

Next, a description will be given of the operation of the BIST circuit built in the LSI according to the second embodiment.

When inputting a clock signal and a control signal transferred externally (supplied from an external tester electrically connected to the LSI as a target of the self-test operation, for example) indicating the commencement of the self-test operation for the memory cell array 51 built in the LSI, the BIST controller 1 generates and outputs a control signal to the test pattern generator 2, the comparator 3, the GO/NG register 4, and the repair code generator/register 7 in order to enter them into the self-test operation mode. Then, the test pattern generator 2 receives the control signal indicating the commencement of the self test operation for the memory cell array 51 transferred from the BIST controller 1, and executes the micro-codes that have been stored in a test program in advance in order to generate test pattern data and expected value data consisting of control signals and data. Following this, the test pattern generator 2 writes the generated test pattern data into the memory cell array 51 and also outputs the generated expected value data into the comparator 3. The comparator 3 reads the test pattern data that have been written into the memory cell array 51 and then compares the data with the expected value data transferred from the test pattern generator 2 in order to check whether the operation of the memory cell array 51 has been completed normally or abnormally.

After the comparison operation performed by the comparator 3, when the test pattern data from the memory cell array 51 are equal to the expected data, the comparator 3 generates and outputs a control signal indicating that the memory cell array 51 operates normally to the GO/NG register 4. On the contrary, when both data are not equal, namely there is at least one data item that is not equal to the corresponding expected value data item, the comparator 3 generates a control signal indicating that the memory cell array 51 has operated abnormally and outputs the control signal into the GO/NG register 4. In addition to this, the comparator 3 generates and outputs data regarding a bit line and a word line at which a faulty memory cell is formed into the repair code generator/register 7.

Next, the repair code generator/register 7 generates a repair code indicating the use of a redundancy memory cell, that has been built in the memory cell array 51 in advance, based on the comparison result transferred from the comparator 3. The redundancy memory cell is used instead of the faulty memory cell. Following this, the selector 6 selects the data stored in the GO/NG register 4 or the data stored in the repair code generator/register 7 under the control of the BIST controller 1 or the external tester (omitted from FIG. 3) outputs the selected one externally. For example, the operation of the external tester flows following operations when the data transferred from the selector 6 indicates that the operation of the memory cell array 51 has been completed normally. on the contrary, if the data transferred from the selector 6 indicates that the memory cell array 51 has operated abnormally, the external tester inputs the data stored in the error information register 5 or the repair code stored in the repair code generator/register 7. Then, according to the repair code about the faulty memory cell, a fuse formed in the redundancy memory cell is burn out or melted by using a laser beam in order to activate the function of the redundancy memory cell. Thereby, the faulty memory cell will be repaired.

As described above, according to the second embodiment, by incorporating the BIST circuit in the LSI including the LSI memory sych as a DRAM, a SRAM, a Flash memory, and the like, it is possible to execute the self test operation for the memory cell array 51 in order to self-diagnose the operation of the memory cell array 51 and to generate the repair code for the faulty memory cell. That is, the operation result of the memory cell array 51 is compared with the expected value data by the comparator 3, and the various kinds of data such as the repair code and the like about the faulty memory cell may be read out selectively from the GO/NG register 4 and the repair code generator/register 7 under the control of the BIST controller 1 or the external tester. It is thereby possible to use a simple logic tester instead of any expensive external tester having many terminals, so that the redundancy memory cell may be used instead of the faulty memory cell. Furthermore, since the number of input/output terminals to be used for the test operation for the memory cell array may be decreased, it is thereby possible to reduce the fabrication cost of the LSI.

Third Embodiment

Figure 4:
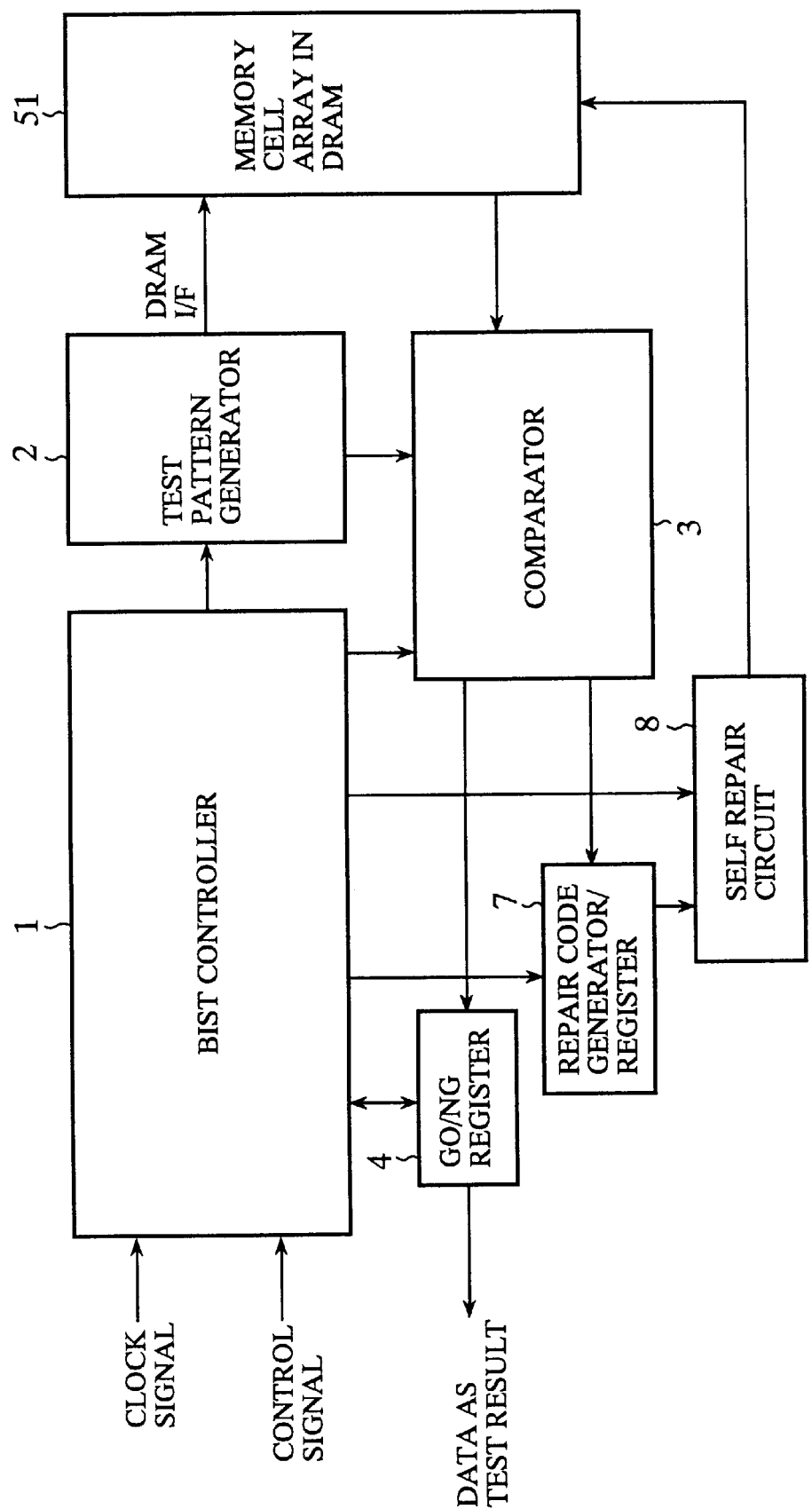
FIG. 4 is a block diagram showing a configuration of a BIST circuit for a large scale integrated memory built in a LSI according to the third embodiment of the present invention.

FIG. 4 is a block diagram showing the configuration of the BIST circuit for a large scale integrated (LSI) memory such as a DRAM, a SRAM, a Flash memory, and the like built in a LSI according to the third embodiment of the present invention. By incorporating this BIST circuit into a LSI, or other integrated devices, the operation test for a built-in LSI memory may be performed, so that a faulty memory cell may be replaced with a redundancy memory cell in order to avoid the use of the faulty memory cell. In FIG. 4, the reference number 8 designates a self-repair circuit for replacing an abnormal bit, namely, a faulty memory cell, with a redundancy memory cell by using a repair code stored in the repair code generator/register 7 in order to avoid the use of the faulty memory call. Other components in the BIST circuit of the third embodiment are the same of the components in the BIST circuit of the second embodiment, and the same reference numbers are used for the same components, and the explanation of them is therefore omitted here for brevity.

Next, a description will be given of the operation of the BIST circuit built in the LSI according to the third embodiment.

When inputting a clock signal and a control signal transferred externally (from an external tester electrically connected to the LSI as a target of the self-test operation, for example) indicating the commencement of the self-test operation for the memory cell array 51 built in the LSI, the BIST controller 1 generates and outputs a control signal to the test pattern generator 2, the comparator 3, the GO/NG register 4, the repair code generator/register 7, and the self-repair circuit 8 in order to enter them into the self-test operation mode. Then, the test pattern generator 2 receives the control signal indicating the commencement of the self test operation transferred from the BIST controller 1 and executes the micro-codes that have been stored in a test program in advance in order to generate the test pattern data and the expected value data consisting of control signals and data. Following this, the test pattern generator 2 writes the generated test pattern data into the memory cell array 51 and also outputs the generated expected value data into the comparator 3. The comparator 3 reads the test pattern data that have been written into the memory cell array 51 and then compares the data with the expected value data transferred from the test pattern generator 2 in order to check whether the memory cell array 51 has operated normally or abnormally.

After the comparison operation by the comparator 3, when the test pattern data from the memory cell array 51 are equal to the expected value data, the comparator 3 generates and outputs a control signal indicating that the memory cell array 51 operates normally to the GO/NG register 4. On the contrary, if both data are not equal, namely there is at least one data item obtained from the memory cell array 51 that is not equal to the corresponding expected value data item, the comparator 3 generates a control signal indicating that the memory cell array 51 operates abnormally, and outputs the control signal into the GO/NG register 4. In addition to this, the comparator 3 generates and outputs data regarding the bit line (as a faulty bit) and the word line, at which a faulty memory cell is formed, into both the repair code generator/register 7 and the self-repair circuit 8.

Next, the repair code generator/register 7 generates a repair code indicating the use of a redundancy memory cell instead of the faulty memory cell, that has been built in the memory cell array 51 in advance, based on the comparison result transferred form the comparator 3 and then stores the repair code.

If the data stored in the GO/NG register 4 indicates that there is a faulty memory cell in the memory cell array 51, the BIST controller 1 generates and then transfer a trigger signal to both the repair code generator/register 7 and the self-repair circuit 8. It is also acceptable to have a configuration in which an external device (omitted from FIG. 4) generates and outputs this trigger signal to both the repair code generator/register 7 and the self-repair circuit 8.

When receiving a trigger signal transferred from the BIST controller 1 or the external tester (omitted from FIG. 4), the repair code generator/register 7 generates and outputs a repair code regarding the faulty memory cell to the self-repair circuit 8. When receiving the trigger signal transferred from the BIST controller 1 or the external device, the self-repair circuit 8 inputs the repair code transferred from the repair code generator/register 7, and outputs an instruction signal, indicating that a fuse in the faulty memory cell is electrically melt and cut by using a laser beam in order to avoid the use of the faulty memory cell and to use the redundancy memory cell instead of the faulty memory cell, based on the repair code regarding the faulty memory cell, for example.

As described above, according to the third embodiment, by incorporating the BIST circuit in the LSI, it is possible to execute the self test operation of the memory cell array 51 in order to self-diagnose the operation of the memory cell array 51 and to generate the repair code for the faulty memory cell. Further, by using the repair code, the BIST circuit replaces the faulty memory cell with the redundancy memory cell in order to avoid the use of the faulty memory cell. That is, the operation result of the memory cell array 51 is read out from the GO/NG register 4, the error information register 5, and the repair code generator/register 7, and then the operation result is compared with the expected value data by the comparator 3 under the control of the BIST controller 1 or the external tester. It is thereby possible to use a simple logic tester instead of any expensive external tester having many terminals, so that the redundancy memory cell may be used instead of the faulty memory cell. Furthermore, since the number of input/output terminals to be used for the test operation may be decreased, it is therefore possible to reduce the fabrication cost of the LSI.

Fourth Embodiment

FIG. 5 is a block diagram showing the configuration of the BIST circuit for a large scale integrated (LSI) memory such as a DRAM, a SRAM, a Flash memory, and the like built in a LSI according to the fourth embodiment of the present invention. By incorporating this BIST circuit into the LSI, or other integrated devices, the operation test for the LSI built-in memory may be performed, so that a faulty memory cell may be replaced with a redundancy memory cell in order to avoid the use of the faulty memory cell. In FIG. 5, the reference number 9 designates a phase locked loop (PLL) for inputting an external clock signal provided from an external device (omitted from FIG. 5) and for generating an internal clock signal, whose frequency is higher than that of the received one, based on the received external clock signal, and then for outputting the internal clock signal to internal circuits such as the BIST circuit in the LSI. Other components in the BIST circuit as the fourth embodiment are the same of the components in the BIST circuit as the third embodiment, the same reference numbers are used for the same components, and the explanation of them is therefore omitted here for brevity.

Next, a description will be given of the operation of the BIST circuit as the fourth embodiment.

First, when inputting the external clock signal supplied from an external tester (omitted from FIG. 5), for example, the PLL 9 multiplies the frequency of the external clock signal and then outputs the multiplied clock signal as the internal clock signal whose frequency is several times or more than that of the received external clock signal. This internal clock signal of the higher frequency may be used for the test operation of the memory cell array 51. The PLL 9 provides the generated internal clock signal to the BIST controller 1 in the BIST circuit according to the fourth embodiment.

Next, when inputting the internal clock signal supplied from the PLL 9 and a control signal indicating the commencement of the self test operation for the memory cell array 51 (transferred from an external tester connected to the LSI as a target of the self-test operation, for example), the BIST controller 1 generates and outputs a control signal indicating the commencement of the self-test operation for the memory cell array 51, the test pattern generator 2, the comparator 3, the GO/NG register 4, the repair code generator/register 7, and the self-repair circuit 8 built in the LSI in order to enter them into the self-test operation mode.

Then, the test pattern generator 2 receives the control signal indicating the commencement of the self test operation transferred from the BIST controller 1 and executes the micro-codes that have been stored in the test program in advance in order to generate the test pattern data and the expected data consisting of control signals and data. Following this, the test pattern generator 2 writes the generated test pattern data into the memory cell array 51 and also outputs the generated expected value data into the comparator 3. The comparator 3 reads the test pattern data that have been written into the memory cell array 51 and then compares the data with the expected value data transferred from the test pattern generator 2 in order to check whether the memory cell array 51 has operated normally or abnormally.

After the comparison operation by the comparator 3, when the test pattern data from the memory cell array 51 are equal to the expected value data, the comparator 3 generates and outputs a control signal indicating that the memory cell array 51 operates normally to the GO/NG register 4. On the contrary, if both data are not equal, namely there is at least one data item obtained from the memory cell array 51 that is not equal to the corresponding expected value, the comparator 3 generates a control signal indicating that the memory cell array 51 has operated abnormally and outputs the control signal into the GO/NG register 4. In addition to this, the comparator 3 generates and outputs data regarding a bit line (as a faulty bit) and a word line, at which a faulty memory cell is formed, into both the repair code generator/register 7 and the self-repair circuit 8.

Furthermore, the repair code generator/register 7 generates a repair code indicating the use of a redundancy memory cell instead of the faulty memory cell, that has been built in the memory cell array 51 in advance, based on the comparison result transferred form the comparator 3 and then stores the repair code therein.

If the data stored in the GO/NG register 4 indicates that the memory cell array 51 includes a faulty memory cell, the BIST controller 1 generates and then transfer a trigger signal to both the repair code generator/register 7 and the self-repair circuit 8. It is possible to have a configuration in which an external device (omitted from FIG. 5) generates and outputs this trigger signal to both the repair code generator/register 7 and the self-repair circuit 8.

When receiving the trigger signal transferred from the BIST controller 1 or the external tester (omitted from FIG. 5), the repair code generator/register 7 generates and outputs a repair code regarding the faulty memory cell to the self-repair circuit 8. When receiving the trigger signal transferred from the BIST controller 1 or the external device, the self-repair circuit 8 inputs the repair code transferred from the repair code generator/register 7, and outputs an instruction signal, indicating that a fuse in the faulty memory cell is electrically melt and cut by using a laser beam in order to avoid the use of the faulty memory cell and to use the redundancy memory cell instead of the faulty memory cell, based on the repair code regarding the faulty memory cell, for example.

The value of the frequency of the internal clock signal generated by the PLL 9 may be designed when this PLL 9 is designed, or for example, it is possible to change the value of the frequency of the internal clock signal programmably based on a control signal provided from an external tester.

In the configuration of the BIST circuit for a LSI memory as the fourth embodiment described above, the PLL circuit 9 is incorporated in the BIST circuit as the third embodiment, however, the present invention is not limited by this configuration, for example, it is also possible to incorporate the PLL 9 into each of the BIST circuits as the first embodiment, and the second embodiment. These configuration above may also obtain the same effect of the fourth embodiment. Furthermore, the operation of this case is the same of the operation of the fourth embodiment, therefore the explanation of the operation is omitted here.

As described above, according to the fourth embodiment, since the PLL 9 for generating the internal clock signal having a desired frequency incorporated in the configuration of the BIST circuit as the third embodiment, it is possible to generate the clock signal having a desired frequency required for the self test operation of the memory cell array 51 and to execute an AT speed memory test for the memory cell array 51. Accordingly, it is possible to use a simple logic tester supplying a clock signal of a lower frequency for the self operation test of the memory cell array 51, for example. That is, in addition to the effect obtained by the configuration of the third embodiment, it is possible to use the simple logic tester instead of any expensive external tester supplying an external clock signal of a higher frequency. Accordingly, the redundancy memory cell may be used instead of the faulty memory cell, and since the number of input/output terminals to be used for the operation test may be decreased, it is possible to reduce the fabrication cost of the LSI.

As described above, according to the present invention, because the Built-In Self Test (BIST) circuit for the large scale integrated (LSI) memory built in the LSI incorporating the LSI has the configuration in which the GO/NG register stores data indicating whether the operation of said memory cell array has been performed normally or abnormally based on the comparison result of the comparator and outputs the data, the error information register stores information regarding a bit line and a word line at which a faulty memory cell is formed when the comparison result from the comparator indicates that said memory cell array has operated abnormally, and the selector selectively outputs the data and the information stored in the GO/NG register and the error information register to external devices, the present invention has the effect that it is not required to use any expensive external tester having many test terminals like a conventional technique, and it is possible to decrease the number of the terminals for the test operation in the LSI and it is also possible to reduce the fabrication cost of the LSI.

In addition, according to the present invention, because the Built-In Self Test (BIST) circuit built in a LSI has the configuration in which the repair code generator/register incorporated in said BIST circuit generates a repair code regarding information of a redundancy memory cell built in the LSI in advance to be used instead of the faulty memory cell when the comparison result from said comparator indicates that the memory cell array has operated abnormally, and the selector selectively outputs the repair code stored in the repair code generator/register and the data stored in the GO/NG register, the present invention has the effect that it is not required to use any expensive external tester having many test terminals like a conventional technique, and it is possible to decrease the number of the terminals for the test operation for the memory cell array in the LSI and it is also possible to reduce the fabrication cost of the LSI.

Further, according to the present invention, because the Built-In Self Test (BIST) circuit built in a LSI has the configuration in which the repair code generator/register generates and stores a repair code regarding a bit line and a word line at which a faulty memory cell is formed when the comparison result from the comparator indicates that the memory cell array has operated abnormally and the self repair circuit reads the data stored in the repair code generator/register and performs a repair operation in which the faulty memory cell is replaced with a redundancy memory circuit that has been built in the memory cell array in advance and the redundancy memory cell is activated, the present invention has the effect that it is not required to use any expensive external tester having many test terminals like a conventional technique and it is also not requited to form any test terminals in the LSI for the test operation, so that it is also possible to reduce the fabrication cost of the LSI.

Moreover, according to the present invention, because the Built-In Self Test (BIST) circuit built in a LSI has the configuration in which the PLL receives an external clock signal supplied externally, and generates an internal clock signal of a predetermined frequency based on the received external clock signal and outputs the internal clock signal into the BIST controller, the present invention has the effect that it is possible to execute an AT speed memory test for the memory cell array by using a simple and cheap external tester for supplying a clock signal of a low frequency, so that it is possible to reduce the fabrication cost of the LSI.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A Built-In Self Test (BIST) circuit for a Large Scale Integrated (LSI) memory built in a LSI incorporating the LSI memory, comprising:

a BIST controller for controlling an operation test for a memory cell array forming the LSI memory having a plurality of memory cells;

a test pattern generator storing micro codes to be used for generation of test pattern data for executing the micro codes based on an instruction transferred from said BIST controller in order to generate the test pattern data and expected data and for outputting the test patterns and the expected data;

a comparator for comparing the test pattern data outputted from said memory cell array, that have read the test pattern data supplied from said test pattern generator, with the expected data;

a GO/NG register for storing data indicating whether the operation of said memory cell array has been performed normally or abnormally based on the comparison result of said comparator and outputting the data;

an error information register for storing information regarding a bit line and a word line at which a faulty memory cell is formed when the comparison result from said comparator indicates that said memory cell array has operated abnormally; and a selector for selectively outputting the data and the information stored in said GO/NG register and said error information register to external devices.

2. A BIST circuit built in a LSI incorporating a LSI memory as claimed in claim 1, further comprising a repair code generator/register, that is incorporated in said BIST circuit instead of said error information register, for generating a repair code regarding information of a redundancy memory cell built in said LSI in advance to be used instead of the faulty memory cell when the comparison result from said comparator indicates that said memory cell array has operated abnormally, and wherein said selector selectively outputs the repair code stored in said repair code generator/register and the data stored in said GO/NG register.

3. A BIST circuit for a LSI memory built in a LSI incorporating the LSI memory as claimed in claim 2, further comprises a phase locked loop (PLL) for receiving an external clock signal supplied externally, for generating an internal clock signal of a predetermined frequency based on the received external clock signal, and for outputting the internal clock signal into said BIST controller.

4. A BIST circuit for a LSI memory built in a LSI incorporating the LSI memory as claimed in claim 1, further comprises a phase locked loop (PLL) for receiving an external clock signal supplied externally, for generating an internal clock signal of a predetermined frequency based on the received external clock signal, and for outputting the internal clock signal into said BIST controller.

5. A Built-In Self Test (BIST) circuit for a Large Scale Integrated (LSI) memory built in a LSI incorporating the LSI memory, comprising:

a BIST controller for controlling an operation test for a memory cell array forming the LSI memory having a plurality of memory cells;

a test pattern generator storing micro codes to be used for generation of test pattern data for executing the micro codes based on an instruction transferred from said BIST controller in order to generate the test pattern data and expected data and for outputting the test patterns and the expected data;

a comparator for comparing the test pattern data outputted from said memory cell array, that have read the test pattern data supplied from said test pattern generator, with the expected data;

a GO/NG register for storing data indicating whether the operation of said memory cell array has been performed normally or abnormally based on the comparison result of said comparator and outputting the data;

a repair code generator/register for generating a repair code regarding a bit line and a word line at which a faulty memory cell is formed when the comparison result from said comparator indicates that said memory cell array has operated abnormally; and a self repair circuit for reading the data stored in said repair code generator/register and for performing a repair operation in which the faulty memory cell is replaced with a redundancy memory circuit that has been built in said memory cell array in advance and the redundancy memory cell is activated.

6. A BIST circuit for a LSI memory built in a LSI incorporating the LSI memory as claimed in claim 5, further comprises a phase locked loop (PLL) for receiving an external clock signal supplied externally, for generating an internal clock signal of a predetermined frequency based on the received external clock signal, and for outputting the internal clock signal into said BIST controller.

* * * * *